(12) United States Patent
Wang et al.

(10) Patent No.: US 7,811,846 B2
(45) Date of Patent: Oct. 12, 2010

(54) SEMICONDUCTOR DEVICES GROWN IN SPHERICAL CAVITY ARRAYS AND ITS PREPARATION METHOD

(75) Inventors: Benzhong Wang, Singapore (SG); Soo Jin Chua, Singapore (SG)

(73) Assignee: Agency for Science, Technology and Research, Centros (SG)

( * ) Notice: Subject to any disclaimer, the term of this patent is extended or adjusted under 35 U.S.C. 154(b) by 701 days.

(21) Appl. No.: 11/385,528

(22) Filed: Mar. 21, 2006

(65) Prior Publication Data

US 2010/0227437 A1    Sep. 9, 2010

Related U.S. Application Data

(60) Provisional application No. 60/663,831, filed on Mar. 21, 2005.

(51) Int. Cl.
*H01L 21/00* (2006.01)
(52) U.S. Cl. .............................. 438/42; 438/34; 438/3; 216/56
(58) Field of Classification Search ................ 324/760, 324/754, 457; 279/3; 73/159
See application file for complete search history.

(56) References Cited

U.S. PATENT DOCUMENTS

| | | | | |
|---|---|---|---|---|
| 3,724,066 | A * | 4/1973 | Wainer et al. | 29/592.1 |
| 5,510,156 | A * | 4/1996 | Zhao | 427/534 |
| 6,828,055 | B2 * | 12/2004 | Kearl | 429/38 |
| 6,890,873 | B2 * | 5/2005 | Oswald et al. | 501/54 |
| 2003/0148088 | A1 | 8/2003 | Padmanabhan et al. | |
| 2004/0124147 | A1 * | 7/2004 | Fissell et al. | 210/650 |

OTHER PUBLICATIONS

Anastasia L. Elias et al., Fabrication of Helically Perforated Gold, Nickel, and Polystyrene Thin Films J. Microelectromechanical systems, vol. 13, No. 5 (2004).*

John C. Hulteen et al., "Nanosphere lithography: A materials general fabrication process for periodic particle array surfaces" J. Vac. Sci. Techno. A 13(3) (1995).*

B. Das and S. P. McGinnis, "Novel template-based semiconductor nanostructures and their applications" J. Appl. Phys. A vol. 71, 681-688 (2000).*

M. Netti et al., Adv. Mater, 13, No. 18, Sep. 14, 2001.*

Nagai et al., Spherical Cavity-Mode Laser with Self-Organized CuCl microspheres, Optics Letters, vol. 22, No. 21, Nov. 1, 1997, pp. 1630-1632.

Fujiwara et al., Upconversion lasing of a thuilium-ion-doped fluorozirconate glass microsphere, Journal of Applied Physics, vol. 86, Sep. 1, 1999, pp. 2385-2388.

(Continued)

*Primary Examiner*—Thanh V Pham
*Assistant Examiner*—Mark A Laurenzi, III
(74) *Attorney, Agent, or Firm*—Heslin Rothenberg Farley & Mesiti P.C.; Victor A. Cardona

(57) ABSTRACT

A method for fabricating an array of semiconductor devices comprising the steps of providing a non-metallic substrate, placing a layer of spheres on said substrate, reducing diameter of the spheres, encapsulating the spheres in a matrix of rigid material, finishing an upper surface of said matrix to expose a portion of said spheres, removing the spheres to form an array of cavities within said matrix, and forming features in said cavities in contact with said substrate so as to form the device.

13 Claims, 5 Drawing Sheets

OTHER PUBLICATIONS

Akabori et al., InGaAs nano-pillar array formation on partially marked InP(111)B by selective area metal-organic vapour phase epitaxial growth for two-dimensional photonic crystal application, Institute of Physics Publishing, Nanotechnology 14 (2003) pp. 1071-1074.

Norris et al., Excitation of a single molecule on the surface of a spherical microcavity, Appl. Phys. Lett. 71 (3), Jul. 21, 1997, pp. 297-299.

Ghanem et al., A double templated electrodeposition method for the fabrication of arrays of metal nanodots, Electrochemistry Communications 6, (2004) pp. 447-453.

Yablonovitch et al. Inhibited Spontaneous Emissions in Solid-State Physics and Electronics, Physical Review Letters, The American Physical Society, vol. 58, No. 20, May 18, 1987, pp. 2059-2062.

Taniguchi et al., Europium chelate solid laser based on morphology-dependent resonances, Appl. Phys. Lett. 67 (8), Aug. 21, 1995, pp. 1060-1062.

Gangloff et al., Self-Aligned, Gated Arrays of Individual Nanotube and Nanowire Emitters, Nano Letters, 2004, vol. 4, No. 9, pp. 1575-1579.

Inari et al., Selective area MOVPE growth of InP and InGaAs pillar structures for InP-based two-dimensional photonic crystals, PHYSICA E, 21 (2004) pp. 620-624.

Artemyev et al., Quantum dots in photonic dots, Applied Physics Letters, vol. 76, No. 11, Mar. 13, 2000, pp. 1353-1355.

Jia et al., Quantum dots in glass spherical microcavity, Applied Physics Letters, vol. 79, No. 2, Jul. 9, 2001, pp. 152-155.

Moller et al., Mode control by nanoengineering light emitters in spherical microcavities, Applied Physics Letters, vol. 83, No. 13, Sep. 29, 2003, pp. 2686-2688.

* cited by examiner

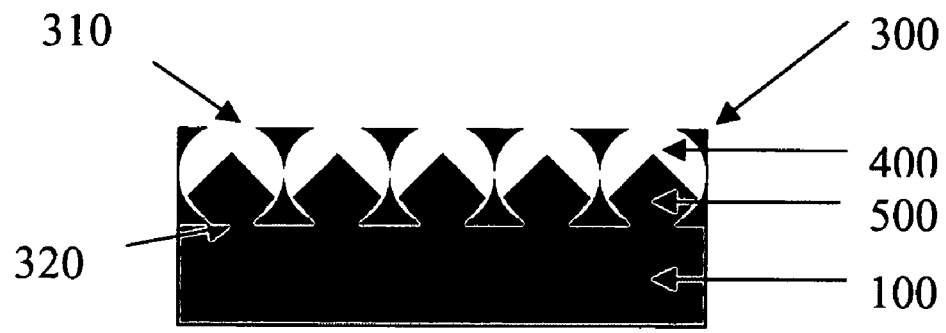
Fig 1 E1
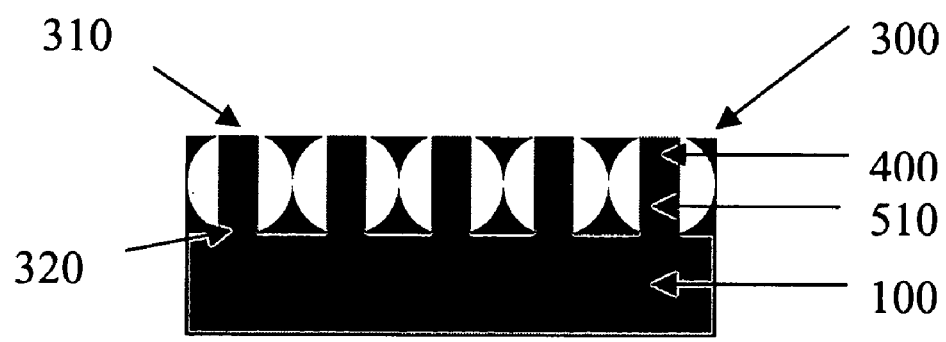
Fig 1 E2
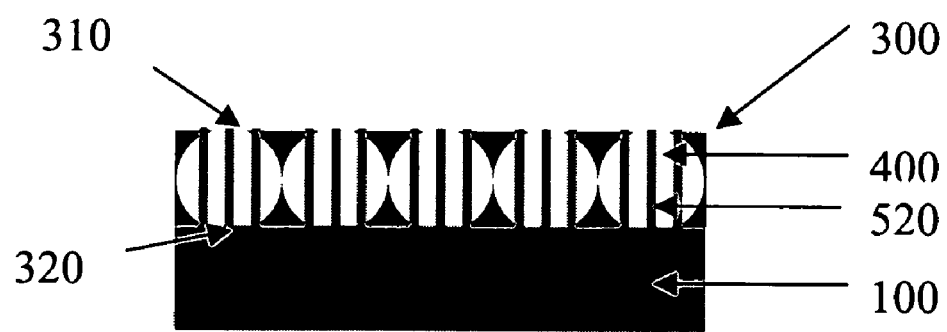
Fig 1 E3

SEMICONDUCTOR DEVICES GROWN IN SPHERICAL CAVITY ARRAYS AND ITS PREPARATION METHOD

CROSS REFERENCE TO RELATED APPLICATIONS

This application claims the benefit of U.S. Provisional Application Ser. No. 60/663,831, filed on Mar. 21, 2005, the entire disclosure of which is incorporated herein by reference.

FIELD OF THE INVENTION

The invention relates to the fabrication of semiconductor devices and in particular the fabrication of a plurality of said devices in periodic arrays upon a substrate.

BACKGROUND

Microcavities have been widely used to fabricate semiconductor lasers, for example, vertical cavity surface emitting lasers (VCSEL), which are key components for information technologies. However, this kind of microcavity confines light in only one dimension, e.g., the vertical dimension. It follows that, it is desirable to confine light in all directions, which should provide higher efficiency for realising low threshold lasers.

A dielectric microsphere, having a diameter comparable to or larger than the wavelength of light, acts as a high-Q (quality factor) optical cavity. The resonant modes are called "whispering gallery modes" (WGMs).

Such microcavity structures can also be used for low-power nonlinear optical switching besides being used in low-threshold lasers.

Another class of nanostructures called "photonic crystals" (PCs), consist of periodically modulated dielectric structures, with high potential to control spontaneous emission and photon transport, and are applicable to more recently developed optical devices. In particular, the formation and characterization of semiconductor two-dimensional (2D) PCs having air/semiconductor interfaces have the advantage of integration to semiconductor optical devices like laser diodes.

Commonly, laser cavities are formed by two facets at two opposite sides of an active medium. However, for compact devices (micro- or nano-scales), these one-dimensional cavities are not efficient enough to provide feedback for lasing.

Alternatively, some dielectric spherical optical cavities have been used in optical devices (resonator) incorporating an active medium (semiconductor materials, semiconductor quantum dots, polymer) to form lasers. But most photonic crystal structures fabricated by growing semiconductor materials have difficulty to make electrically contact.

SUMMARY OF INVENTION

In a first aspect the invention provides a method for fabricating an array of semiconductor devices comprising the steps of providing a non-metallic substrate; Placing a layer of spheres on said substrate; reducing diameter of the spheres; encapsulating the spheres in a matrix of rigid material; finishing an upper surface of said matrix to expose a portion of said spheres; removing the spheres to form an array of cavities within said matrix, and; forming features in said cavities in contact with said substrate so as to form the device.

The present invention uses micro- or nano-spheres as template to obtain micro- or nano-scaled spherical cavities on semiconductor substrates, and then selectively grow nanostructures of semiconductor materials into the spherical cavities. Using this method, light-emitting semiconductors may be epitaxially grown into the spherical cavities. The spherical cavity may provide almost all-directional confinement for light, which efficiently reduces threshold for lasing or enhances light extraction efficiency for light emitting diodes or enhances absorption of light for detectors by making using of photonic crystal effects.

The top surface of the spherical cavity arrays may provide good support for the electrode for making electrical contact with the semiconductor nanostructure arrays when it grows up to the top surface of the spherical cavity arrays.

Preferred embodiments according to the present invention may provide several advantages and unique features. Firstly, the period and size of the spherical cavities may be changed from one hundred nanometers to several micrometers by using different sized sphere template. For different applications, different size or periodicity of the structures may be useful. For example, for active photonic crystal application, the period of the structures may be in the wavelength range of emitting or receiving light which changes from several hundred nanometers (visible) to several or several ten thousands nanometers (infrared).

The diameter of the spherical cavities may be easily reduced, while keeping the period fixed, by reducing diameters of the spheres after their arrangement. For some applications, for example, photonic crystals, the ratio of diameter of individual structure and periodicity may be a key parameter for controlling optical properties.

Spherical cavities with different materials may be obtained according to their application, for example, spherical metal cavities, which have very high reflectance or spherical polymer cavities.

Chemical vapor deposition (MOCVD for InP, GaAs, GaN based materials), physical vapor deposition (MBE for GaAs, GaN based materials), and emulsion phase epitaxy (for example, low temperature ZnO) may be used to fabricate various kinds nanostructures inside or through the spherical cavities. Those structures may be used in light emitting and receiving devices (detectors, solar cells), which benefited by resonant of spherical cavities or enhancement of photonic crystal structures. The self-alignment of nanowires may also make them suitable for use as field emitting devices.

BRIEF DESCRIPTION OF THE DRAWINGS

It will be convenient to further describe the present invention with respect to the accompanying drawings, which illustrate possible arrangements of the invention. Other arrangements of the invention are possible and consequently the particularity of the accompanying drawings is not to be understood as superseding the generality of the preceding description of the invention.

FIG. 1 A2 is a top view schematic drawing showing the diameter of the spheres of FIG. 1 A1 on the selected substrate being reduced to a predetermined value.

FIG. 1 E1 is a side view schematic drawing of one embodiment of a semiconductor structure grown epitaxially into or through the spherical cavity array of FIG. 1D.

FIG. 1 E2 is a side view schematic drawing of one embodiment of a semiconductor structure grown epitaxially into or through the spherical cavity array of FIG. 1D.

FIG. 1 E3 is a side view schematic drawing of one embodiment of a semiconductor structure grown epitaxially into or through the spherical cavity array of FIG. 1D.

DETAILED DESCRIPTION

FIGS. 1A to 1E outline the process for growing semiconductor nanostructures into 2D ordered spherical silica nanocavities according to an embodiment of the present invention. The process commences with forming a 2D hexagonally close-packed (hcp) colloidal monolayer composed of polystyrene (PS) spheres with diameter of 300 nm by spin coating. GaAs substrates 100 were used in these experiments, which were treated by ozone at 130° C. for 5 min. This treatment resulted in a hydrophilic surface of the GaAs substrate, which is useful for arranging the PS spheres. The concentration of the purchased suspension with mean diameter 300 nm was 10% w/w, which was then diluted with deionized (DI) water 1:1 to form a solution.

Figure 1:
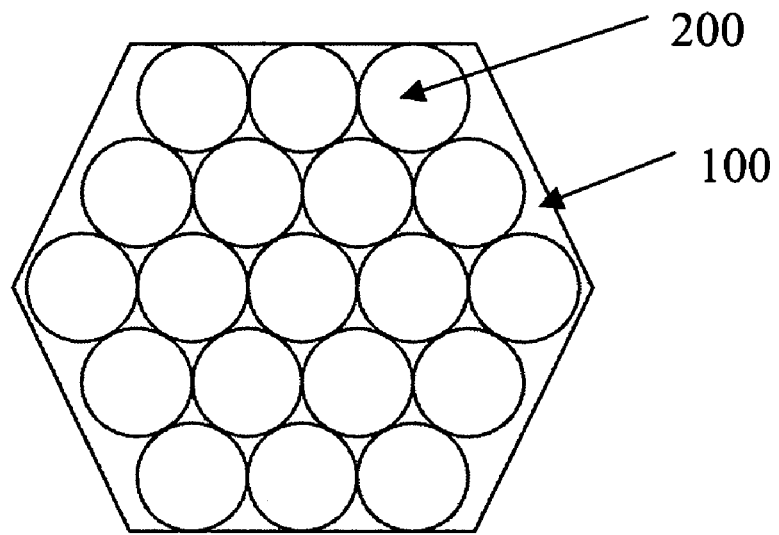
FIG. 1 A1 is a top view schematic drawing showing monolayer latex spheres being arranged on a selected substrate, which acts as a template, according to an embodiment of the present invention.
Figure 1:
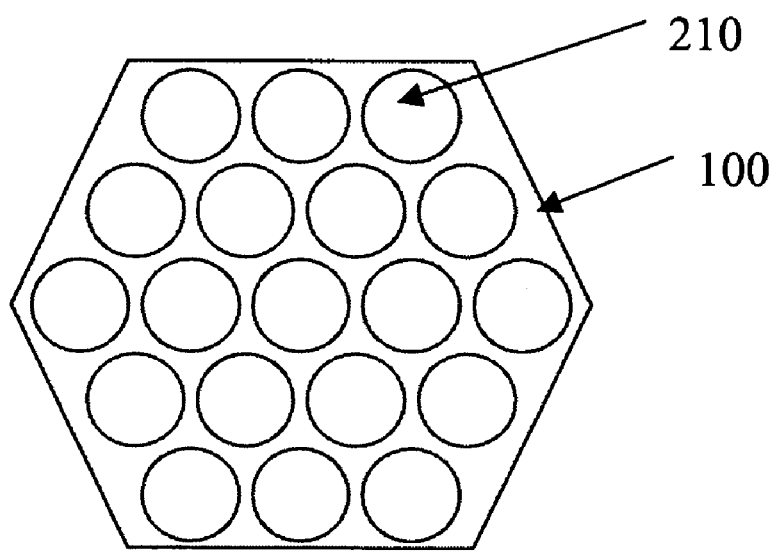
Figure 1B:
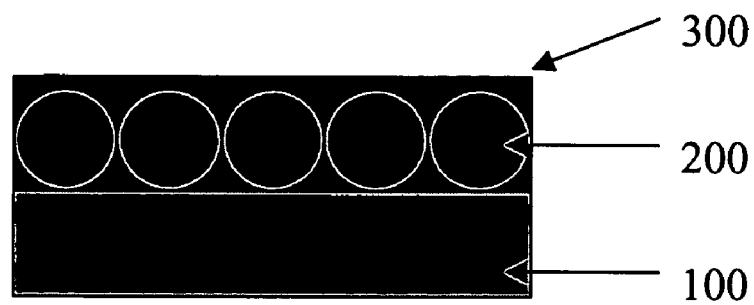
FIG. 1B is a cross-sectional view schematic drawing showing formation of a film of selected material, which contains the latex sphere template, according to an embodiment of the present invention.

Mono-layered hcp arrays of the PS spheres 200 were obtained by spin-coating the colloidal suspension at 800 rpm for 60 s (FIG. 1 A1). Then, as shown in FIG. 1B, several drops of liquid silica were put onto the whole surface of the wafer having the PS sphere template 200. The solution quickly infiltrated into the spaces between the PS spheres due to capillary action. The extra materials of the liquid silica were spun off by rotating the wafer at a speed of 5000 rpm for 30 s to form uniform silica film 300, which contains the PS sphere template 200. Normally, the thickness of the silica film formed by spin-coating is around 150 nm. However, due to presence of the PS sphere template, the thickness of the silica film formed on the wafer should be approximately the thickness of the film formed on a flat surface plus the diameter of the spheres.

Figure 1C:
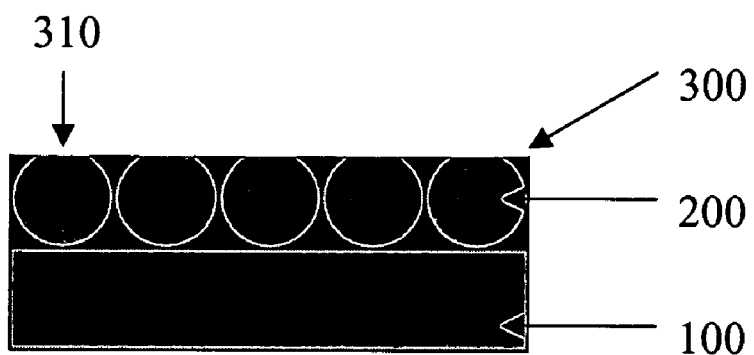
FIG. 1C is a cross-sectional view of a thin layer of the surface of the film of FIG. 1B having been removed so that the top of the latex spheres is exposed.
Figure 1D:
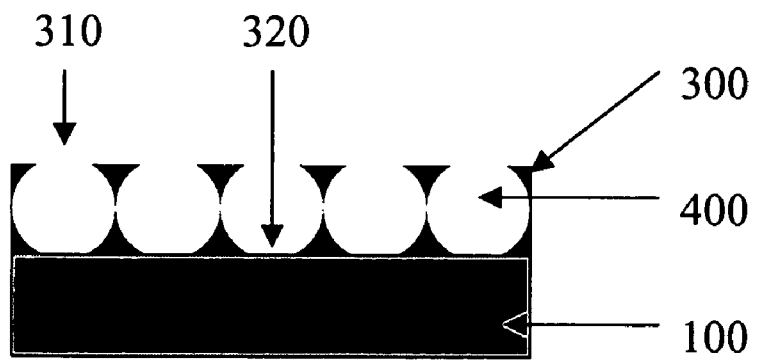
FIG. 1D is a cross-sectional view schematic drawing where the latex spheres of FIG. 1C have been selectively etched off.

The silica film 300 containing the PS sphere template 200 was further densified by heating in air environment at 250° C. for 15 min. Then ICP dry etching using mixed $CF_4$ plus $O_2$ gases was used to etch away a thin layer of the silica film 300 on the top of the PS sphere template 200 to form top openings 310, which exposes the spheres as shown in FIG. 1C. The ICP dry etchings were performed employing these condition: $CF_4$, 20 sccm; $O_2$, 10 sccm; RF power, 100 W; ICP power, 500 W; chamber pressure, 8 mTorr. The PS sphere template 200 was etched off in supersonic bath in toluene solution, then spherical silica nanocavities 400 with circular top openings 310 and bottom openings 320 were formed on the GaAs substrate 100 as shown in FIG. 1D.

The top openings of the silica nanocavities 310 allow reactive gases to diffuse into the nanocavities 400. Following MOCVD growth, semiconductor nanostructures are deposited on the GaAs surface defined by bottom opening 320 of the silica nanocavities as shown in FIG. 1E.

Figure 2A:
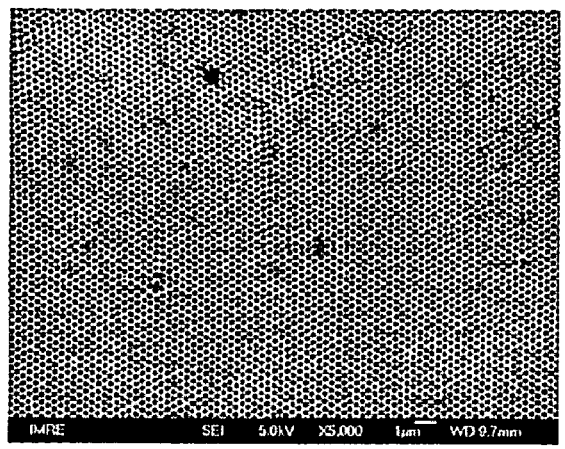
FIG. 2A is a top view of a SEM image of a $SiO_2$ spherical nanocavity array fabricated according to an embodiment of the present invention.
Figure 2B:
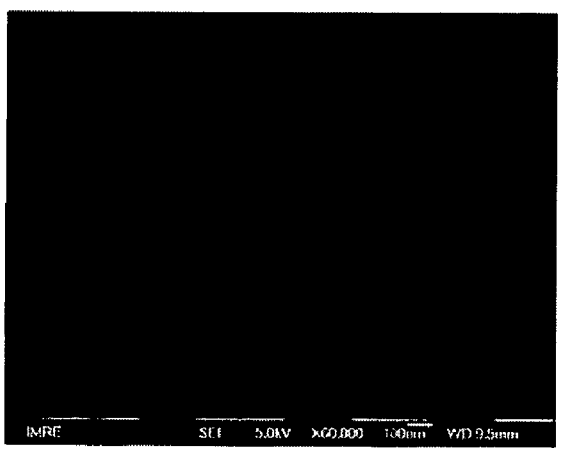
FIG. 2B is a top view of a SEM image of a $SiO_2$ spherical nanocavity array fabricated according to an embodiment of the present invention.
Figure 2C:
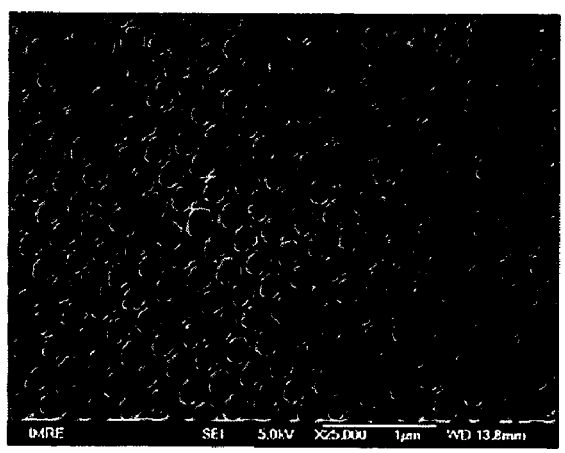
FIG. 2C is a tilted view SEM image of the $SiO_2$ spherical nanocavity array fabricated according to an embodiment as shown in FIG. 2B.

Shown in FIG. 2A (low magnification) and 2B (high magnification) are typical SEM images of the wafer after the processes shown in FIGS. 1A to 1D at the dry etching (FIG. 1C) duration of 5 min. It is clearly seen that honeycomb structures with excellent uniformity are formed. The tilted (45°) top view SEM image as shown in FIG. 2C indicated a relatively smooth top surface of the honeycomb structures. The mean diameter of the openings is about 200 nm. The period of the honeycomb structures is about 315 nm, which is a little larger than that of the PS spheres used as the template (~300 nm).

Different kinds of semiconductor micro or nanostructures can be grown epitaxially into or through the spherical $SiO_2$ cavities by changing the growth conditions, substrate orientations, growth materials, and growth techniques. For example, vertically aligned pillar structures of GaAs, AlGaAs, InGaAs, or their combinations can be selectively grown into or through the spherical $SiO_2$ nanocavities by MOCVD or MBE on a <111>B GaAs substrate (FIG. 1E2). Nanowires arrays of those materials can be selectively deposited into or through the spherical $SiO_2$ nanocavities by using Au nanoparticle catalysts via vapor-liquid-solid mechanism (as shown in FIG. 1E3).

Pyramidal-like nanostructures (FIG. 1E1) of InGaAs/GaAs quantum structures also can be epitaxially grown into the spherical $SiO_2$ nanocavity arrays by using MOCVD as shown in FIGS. 3A to 3D.

A low-pressure horizontal MOCVD system was employed to carry out the growth of InGaAs/GaAs nanostructures into the spherical $SiO_2$ nanocavity arrays. Trimethylgallium (TMGa), trimethylindium (TMIn) were used as group III sources, and TBAs was utilized as the group V sources. The growth temperature of quantum well (s) (QWs) was 600° C. as measured by a thermocouple inserted into the graphite susceptor. The growth chamber pressure was set at 100 mbar. The V/III ratio was 100 and the growth rate was about 0.1 nm/s. One and two InGaAs QWs with thickness of 5 nm separated by a 8 nm GaAs barrier layer was grown after 100 nm GaAs buffer layer was grown at 650° C. Before growth, the wafer with silica spherical cavity arrays was treated at 680° C. for 5 min in $H_2$.

Figure 3A:
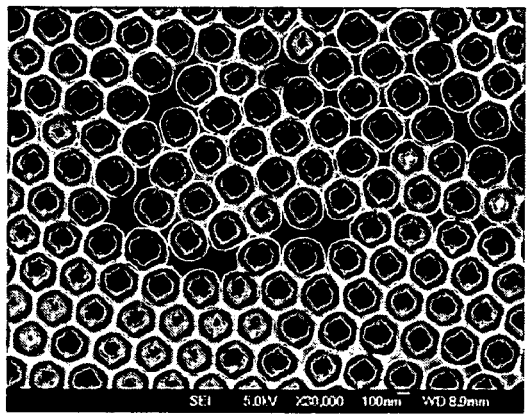
FIG. 3A is a top view of SEM images of InGaAs/GaAs quantum well nanostructures grown into the $SiO_2$ spherical nanocavity array according to an embodiment of the present invention.

FIG. 3A shows a typical SEM image of the wafer with one InGaAs QW. It is clearly observed that individual nano dot has a flat top surface with six side facets. As deposition of materials was increased, the top surface [<001> facet] disappeared while four large side facets emerged to form pyramidal-like structures as observed in FIG. 3B, which shows the SEM image of the sample with double QWs. In addition, two small side facets posited opposite were also observed. The structural evolution can be explained basically by different facet growth rates of a monocrystalline.

Figure 3B:
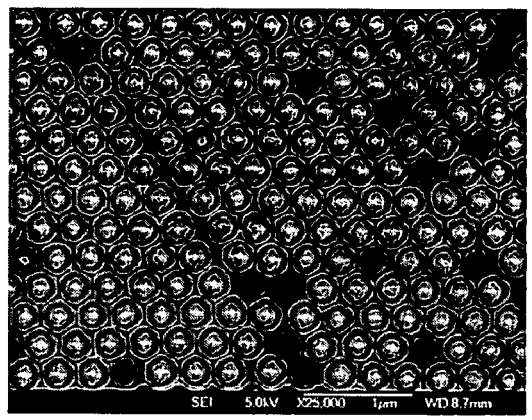
FIG. 3B is a top view of a SEM image of InGaAs/GaAs quantum well nanostructure grown into the $SiO_2$ spherical nanocavity array according to an embodiment of the present invention.
Figure 3C:
FIG. 3C is a cross-section view of a SEM image of the InGaAs/GaAs quantum well nanostructures as shown in FIG. 3B.
Figure 3D:
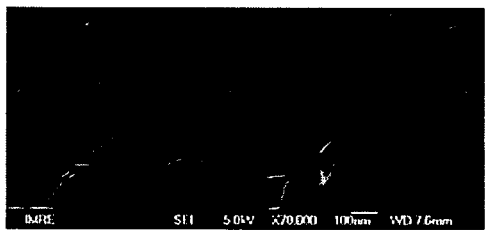
FIG. 3D is a cross-section view of a SEM image of the InGaAs/GaAs quantum well nanostructures as shown in FIG. 3B.

Cross-section view of the structure as shown in FIG. 3B is shown in FIGS. 3C and 3D. It is clearly revealed that the nanostructures of InGaAs/GaAs are grown inside the spherical $SiO_2$ nanocavities with good uniformity. The nanostructures with clear facets are also observed. The facets can be identified to be <111> and <110> according their angle relationship. Therefore, the four large facets observed on the top view SEM image as shown in FIG. 3B belong to <110>, while the small two facets opposite each other belong to <111>.

The invention claimed is:

1. A method for fabricating an array of semiconductor devices comprising the steps of:
   providing a non-metallic substrate;
   placing a layer of spheres on said substrate;
   reducing diameters of the spheres to result in reduced diameter spheres; then
   encapsulating the reduced diameter spheres in a matrix of rigid material;
   finishing an upper surface of said matrix to expose a portion of said spheres;
   removing the spheres to form an array of cavities within said matrix, and;
   forming features in said cavities in contact with said substrate so as to form the device.

2. The method according to claim 1, wherein the encapsulating step comprises the step of electroplating a metal about the spheres to form the matrix.

3. The method according to claim 1, wherein the encapsulating step comprises the steps of introducing a liquid material to immerse the spheres, then solidifying said liquid to form the matrix.

4. The method according to claim 1, wherein the encapsulating step comprises the step of depositing material around the spheres by CVD to form the matrix.

5. The method according to claim 3, wherein said liquid is $SiO_2$.

6. The method according to claim 1, wherein the finishing step comprises etching the upper surface of the matrix.

7. The method according to claim 1, wherein the finishing step comprises polishing the upper surface of the matrix using a CMP process.

8. The method according to claim 1, further comprising the step of etching a bottom surface of the cavities to further expose the substrate.

9. The method according to claim 1, wherein the step of forming features in the cavities includes depositing semiconductor materials using a CVD, or MOCVD, or MBE process.

10. The method according to claim 1, wherein the step of forming features in the cavities includes depositing materials using spin-off process.

11. The method according to claim 1, wherein the reduction of the diameter of the spheres is in the range of 0% to 50% of the diameter.

12. The method according to claim 1, wherein the spheres are of a material having different etching properties to those of the material of the matrix.

13. The method according to claim 1, wherein the spheres are of a material having different etching properties to those of the material of the substrate.

* * * * *